United States Patent [19]
Beneking

[11] Patent Number: 5,422,731
[45] Date of Patent: Jun. 6, 1995

[54] SEMICONDUCTOR ARRANGEMENT MADE OF COMPOUND SEMICONDUCTOR MATERIAL

[75] Inventor: Heinz Beneking, Aachen, Germany

[73] Assignee: Temic Telefunken Microelectronic GmbH, Heilbronn, Germany

[21] Appl. No.: 581,413

[22] Filed: Sep. 12, 1990

Related U.S. Application Data

[63] Continuation of Ser. No. 833,182, Feb. 26, 1986, abandoned.

[30] Foreign Application Priority Data

Mar. 7, 1985 [DE] Germany .................. 35 08 024.8

[51] Int. Cl.⁶ .................. H01L 29/167; H01L 29/207; H01L 29/227
[52] U.S. Cl. ...................... 257/609; 257/12; 257/183; 257/191; 257/607
[58] Field of Search .................... 357/4, 17, 16, 61, 63; 257/607, 609

[56] References Cited

U.S. PATENT DOCUMENTS

| | | | |
|---|---|---|---|
| 3,958,143 | 5/1976 | Bell | 357/16 X |
| 3,982,261 | 9/1976 | Antypas | 357/16 |
| 4,237,471 | 12/1980 | Pommerrenig | 357/30 |
| 4,450,463 | 5/1984 | Chin | 357/45 L X |
| 4,584,174 | 4/1986 | Morioka et al. | 420/555 |

OTHER PUBLICATIONS

Norieka, A. J., et al. "Indium Antimonide-bismuth Compositions Grown by Molecular Beam Epitaxy" J. Appl. Phys. 53(7) Jul., 1982, pp. 4932–4937.
Forrest, S. R., et al. "An n-In(0.53)Ga(0.47)As/n-InP Rectifier" J. Appl. Phys. 52(9) Sep. 1981, pp. 5838–5842.
G. Jacob, "How to Decrease Defect Densities in LEC-SI GaAs and InP Crystals", Semi-insulating III–V Materials, Evian (1982), Shiva Publications, Ltd., Northwick, Cheshire, England, pp. 2–17.
M. Duseaux et al, "Growth and Characteization of Large Dislocation-Free GaAs Crystals for Integrated Circuits Applications", *Semi-Insulating III-V Materials, Kah-neeta (1984)*, Shiva Publications, Ltd., Nautwick, Cheshire, England, pp. 118–125.
H. M. Hobgood et al, "Large Diameter, Low Dislocation In-Doped GaAs: Growth, Characterization and Implications for FET Fabrication", Semi-Insulating III–V Materials, Kah-neeta (1984), Shiva Publications, Ltd., Nautwick, Cheshire, England, pp. 149–156.
H. V. Winston et al. "FET Arrays on In-Alloywed GaAs Substrates", *Semi-insulating III-V Materials,* Kah-neeta (1984), Shiva Publications, Ltd., Nautwick, Cheshire, England, pp. 402–405.

*Primary Examiner*—Sara W. Crane
*Attorney, Agent, or Firm*—Spencer, Frank & Schneider

[57] ABSTRACT

The invention relates to a semiconductor arrangement made of compound semiconductor material and consists in that the semiconductor body contains in areas and, in the case of phosphide compounds throughout its entirety or in areas, isoelectronic impurities made of an element whose covalent atom radius is larger than that of the element of the compound semiconductor, which the impurity material is isoelectronic.

16 Claims, 1 Drawing Sheet

FIG. 1
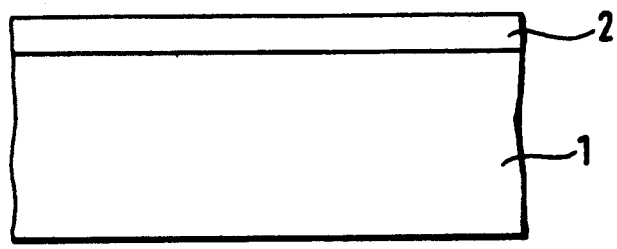
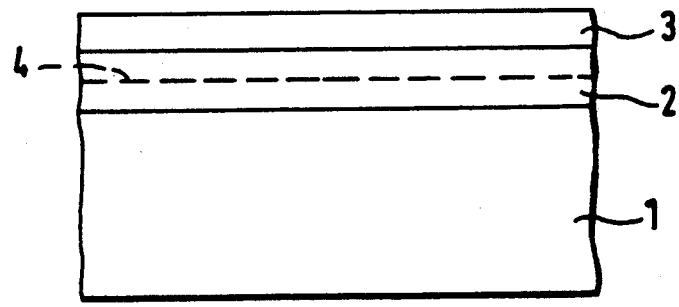
FIG. 2

SEMICONDUCTOR ARRANGEMENT MADE OF COMPOUND SEMICONDUCTOR MATERIAL

This application is a continuation, of application Ser. No. 06/833,182, filed Feb. 26th, 1986, now abandoned.

BACKGROUND OF THE INVENTION

Compound semiconductor material is often used in the manufacture of electronic components. The most common compound semiconductor materials consist of substances of the III and V groups of the Periodic Table, in particular, gallium arsenide or indium phosphide. Multiple compounds, for example, GaAlAs, GaInAs or GaInAsP are also often used. In particular, optoelectronic components, semiconductor lasers, components with Schottky junctions and integrated semiconductor circuits are manufactured on the basis of such semiconductor materials. The starting point in the manufacture of the aforementioned components is a base body which may be manufactured in various ways, for example, by zone melting, by the horizontal Bridgman process or by the LEC (liquid encapsulated Czochralski) process. One or several semiconductor layers is/are deposited—preferably by epitaxial deposition—on this base body.

The dislocation concentration in the semiconductor base body is decisive to the quality of the epitaxial layers which may be deposited by liquid-phase epitaxy or by vapor-phase epitaxy. To each further epitaxial layer growing, the height of the dislocation concentration in the epitaxial layers located thereunder is of essential importance. In the pertinent literature, dislocation concentrations of between $10^4$–$10^5$/cm$^2$ are indicated as relatively low.

For the manufacture of high quality components, the aforementioned dislocation concentration values are, however, much too large. To manufacture field-effect transistors, for example, certain structures are built into the base bodies with the aforementioned dislocation concentrations by, implantations of impurities. The electric characteristic values of these field-effect transistors are considerably impaired by the aforementioned high dislocation concentration in the base body.

The dislocations which continue in the epitaxial layers also cause serious disturbances in the build-up of multilayer structures with heterojunctions. In these components, layers which do not exhibit exactly the same lattice spacing with respect to each other and to the semiconductor base body are deposited on a base body. The base body often consists of a dual compound semiconductor such as gallium arsenide or indium phosphide, on which layers of ternary or quaternary material such as, for example, GaAlAs or GaInAsP are deposited. Since the lattice spacings of the materials of the various layers do not exactly coincide with one another, but a monocrystalline growth is required, it is clear that a high dislocation concentration in the base body or in the base layer provided for the deposition has a very disturbing effect. A number of recombination centers which result in a very strong decrease of the carrier lifetime then occur in the aforementioned epitaxial layers. The characteristic lines of the junctions between various layers and between the base body and the epitaxial layer arranged thereon is substantially impaired by the high dislocation concentration in comparison to the ideal values. In light emitters, a high dislocation concentration causes a bad luminescence efficiency, which results in a low efficiency of light emitting diodes and laser arrangements.

SUMMARY OF THE INVENTION

The object underlying the invention is to provide a semiconductor arrangement made of compound semiconductor material, wherein the semiconductor body exhibits, in areas or, in the case of certain materials throughout its entirety, a dislocation concentration which is substantially less than in the known arrangements. This object is attained in accordance with the invention in that the semiconductor body contains in areas isoelectronic impurity material made from an element whose covalent atom radius is larger than that of the element of the compound semiconductor, to which the impurity material is isoelectronic. The object is also attained in that the semiconductor body consists of a phosphide compound and contains, throughout its entirety or in areas, isoelectronic impurity material made from an element whose covalent atom radius is larger than that of the element of the compound semiconductor, with which the impurity material is isoelectronic.

A fixing and thus termination of the further growth of dislocations in the epitaxial layers during their manufacture is attained by the building-in of deformation centers in accordance with the invention. These deformation centers should not cause an additional, undesired doping of the semiconductor body, which is attained by use of isoelectronic impurity material. As a rule, the building-in of impurity atoms which do not belong to the III and V groups of the Periodic Table is also thereby rendered more difficult.

The semiconductor arrangements according to the invention preferably consist of III/V compound semiconductor material. If the compound material is, for example, indium phosphide, arsenic, antimony or bismuth are suitable as isoelectronic impurity material. Aluminum and gallium are isoelectronic in relation to indium, but both atoms have a smaller covalent radius than indium and, therefore, fail to compensate for the dislocations. In contrast to this, the materials arsenic, antimony and bismuth which are isoelectronic in relation to phosphorous have a larger covalent atom radius, and an effective compensation of the dislocations can, therefore, be achieved with these elements. In the case of gallium arsenide or gallium phosphide, the addition of impurities of the III group of the Periodic Table, in particular, indium, causes a substantial reduction in the dislocation concentration, which is due to the fact that indium has a larger covalent atom radius than the gallium which is isoelectronic in relation to indium.

The semiconductor arrangement according to the invention preferably comprises several layers, and it may be adequate to insert the isoelectronic impurity material only into a first layer which therefore has a very low dislocation concentration of approximately $10^3$ cm$^{-2}$ and smaller. The epitaxial layers deposited on this modified base body then similarly grow with a very low dislocation concentration, with the result that the components to be manufactured exhibit substantially improved electric properties.

BRIEF DESCRIPTION OF THE DRAWINGS

FIG. 1 is a partial side view of a semiconductor body according to one embodiment of the invention.

FIG. 2 is a partial side view of a semiconductor body according to a further embodiment of the invention.

DESCRIPTION OF THE PREFERRED EMBODIMENTS

FIG. 1 shows, for example, a base body or substrate 1 which consists of indium phosphide and has been manufactured in accordance with the known LEC process. This semiconductor body is uniformly doped with arsenic during the manufacturing process, more particularly, in a concentration which is preferably larger than $5 \cdot 10^{18}$ atoms/cm$^3$. The dislocation concentration of this base body is $10^3$ cm$^{-2}$. One or several epitaxial layers 2 with a low dislocation concentration can then be deposited on this base body without isoelectronic impurities having to be added during the layer deposition. The base body may also consist of gallium phosphide or aluminum phosphide.

In the arrangement according to FIG. 2, the starting point is a base body 1 which consists, for example, of indium phosphide and contains no isoelectronic impurities. The dislocation concentration in this base body is $10^4$–$10^5$/cm$^2$. An expitaxial layer 2 which is at least 1 $\mu$m thick and contains isoelectronic impurities is then deposited on this base body. If the epitaxial layer 2 similarly consists of indium phosphide, arsenic with an impurity concentration larger than $5 \cdot 10^{18}$ atoms/cm$^3$, antimony or bismuth are then suitable as isoelectronic impurity material. The epitaxial layer 2 may also consist of ternary or quaternary material such as GaInAs or GaInAsP. In this case, antimony or bismuth is suitable as isoelectronic impurity material.

The isoelectronic impurities cause a slight change in the lattice constants which is smaller than $10^{-4}$. Normally, this slight change in the lattice constants does not have a disturbing effect on the further growth of the epitaxial layers. If, however, in the case of heterojunctions, the lattice constant of the base body 1 deviates from that of the growing epitaxial layer 2, it is recommended to add the isoelectronic impurity material to the material for the epitaxially growing semiconductor layer such that the concentration increases with the growth of the layer, i.e., in the direction of growth. In the case of liquid-phase epitaxy, this may be achieved by the, concentration of the isoelectronic impurities in the melt being continually increased. If there is to be deposited on the epitaxial layer 2, a further epitaxial layer 3 whose material and thus whose lattice constant differs from that of the layer 2, it is recommended to add the isoelectronic impurity material to the material for the semiconductor layer 2 such that the concentration increases with the growth of the layer up to a maximum and then decreases again. The maximum of the impurity concentration of the isoelectronic impurity material is indicated by line 4 in FIG. 2. This results in the layer 2 not exhibiting at the junctions to the base body 1 and to the layer 3 any additional change in the lattice constants caused by the isoelectronic impurity material, but in the dislocation concentration having been considerably reduced. The growing epitaxial layer 3 will therefore likewise exhibit a low dislocation concentration even if no isoelectronic impurities have been built into this layer itself.

In the manufacture of layer 2 by liquid-phase epitaxy with an impurity maximum, the fraction of the isoelectronic impurities in the melt is first continuously increased during the growing process. Once the maximum has been reached, the concentration of the isoelectronic impurities is, for example, reduced by the fraction of the other constituents in the melt being continuously increased. It is also possible to provide isoelectronic impurities both in the base body and in one or several grown epitaxial layers. One may proceed accordingly in the case of layer manufacturing by the gas-phase epitaxy process, in which case the isoelectronic doping may then also be carried out by the addition of components in a corresponding gaseous form.

The material fraction of the isoelectronic substance is preferably less than 0.5% of the element in relation to which the aforementioned substance is isoelectronic. Experimental tests have shown that values of between 0.1 and 0.3% are fully adequate.

The inventive semiconductor arrangement and the process for its manufacture are suitable, in particular, for the production of optoelectronic components, laser arrangements, storage components, integrated circuits and components with Schottky contacts.

What is claimed is:

1. In a semiconductor arrangement made of compound semiconductor material including a multi-layered semiconductor body having a plurality of layers of different compound semiconductor material epitaxilly grown on a base body; the improvement wherein at least one of said epitaxially grown layers is doped with an isoelectronic impurities material of an element whose covalent atom radius is larger than that of the element of the compound semiconductor material of said at least one layer with which the isoelectronic impurity material is isoelectronic.

2. Semiconductor arrangement according to claim 1, wherein said compound semiconductor material of said multi-layered semiconductor body is formed of different III/V compounds.

3. Semiconductor arrangement according to claim 2, wherein the compound semiconductor material of said at least one layer containing said isoelectronic impurity is aluminum phosphide, indium phosphide or gallium phosphide and wherein said isoelectronic impurities are an element of the V group of the Periodic Table whose covalent atom radius is larger than that of phosphorous.

4. Semiconductor arrangement according to claim 3, wherein the isoelectronic impurities consist of arsenic, antimony or bismuth.

5. Semiconductor arrangement according to claim 1, wherein the compound material of said at least one layer containing isoelectronic impurities is formed of gallium arsenide or gallium phosphide and wherein the isoelectronic impurities of the III group of the Periodic Table whose covalent atom radius is larger than that of gallium.

6. Semiconductor arrangement according to claim 1 wherein said base body is not doped with isoelectronic impurities.

7. Semiconductor arrangement according to claim 4, wherein the semiconductor material of said at least one layer containing isoelectronic impurities is indium phosphide and the isoelectronic impurity arsenic in a concentration larger than $5 \cdot 10^{18}$ atoms/cm$^3$.

8. Semiconductor arrangement according to claim 1 wherein said at least one layer is formed of a material having a different lattice constant than the material of the layer on which it is formed, and the concentration of the isoelectronic impurities in said at least one epitaxial layer increases in the direction of growth of said at least one epitaxial layer.

9. Semiconductor arrangement according to claim 8 wherein said at least one epitaxial layer is at least 1 $\mu$m thick.

10. Semiconductor arrangement according to claim 1 wherein: said base body consists of indium phosphide; said plurality of layers includes one or several epitaxially grown semiconductor layer(s) of GaInAs or GaInAsP; and said isoelectronic impurities in said at least one epitaxial layer consist of antimony or bismuth.

11. Semiconductor arrangement according to claim 1 wherein: said at least one layer is bordered on both sides by respectively different compound semiconductor materials which are different than that of said one layer; and the concentration of said isoelectronic impurity material first increases to a maximum in the course of the layer growth of said at least one layer and then decreases again.

12. Semiconductor arrangement according to claim 1 wherein said at least one layer is directly disposed on the surface of said base body.

13. A semiconductor arrangement as defined in claim 1 wherein said isoelectronic impurity material consists of an element whose covalent atom radius is larger than that of the element of said compound semiconductor material of said at least one layer with which the impurity material is isoelectronic.

14. A semiconductor arrangement according to claim 6 wherein said at least one layer is directly disposed on the surface of said base body.

15. A semiconductor arrangement according to claim 1 wherein the material fraction of said isoelectronic impurity material element is less than 0.5% of said element with which said impurity element is isoelectronic of said compound semiconductor material of said at least one layer.

16. A semiconductor arrangement according to claim 15 wherein said material fraction of said isoelectronic impurity material element is between 0.1 and 0.3% of said element of said compound semiconductor material of said at least one layer.

* * * * *